US012676595B2

(12) United States Patent
  Okada et al.

(10) Patent No.: US 12,676,595 B2
(45) Date of Patent: Jul. 7, 2026

(54) ACOUSTIC WAVE DEVICE

(71) Applicant: Murata Manufacturing Co., Ltd., Nagaokakyo (JP)

(72) Inventors: Takuro Okada, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 819 days.

(21) Appl. No.: 18/108,067

(22) Filed: Feb. 10, 2023

(65) Prior Publication Data

US 2023/0198500 A1     Jun. 22, 2023

Related U.S. Application Data

(63) Continuation of application No. PCT/JP2021/030311, filed on Aug. 19, 2021.

(30) Foreign Application Priority Data

Aug. 19, 2020   (JP) ................................. 2020-138818

(51) Int. Cl.
  *H03H 9/17*      (2006.01)
  *H03H 9/02*      (2006.01)
         (Continued)

(52) U.S. Cl.
  CPC ........ *H03H 9/176* (2013.01); *H03H 9/02133* (2013.01); *H03H 9/133* (2013.01); *H03H 9/562* (2013.01)

(58) Field of Classification Search
  CPC ........... H03H 9/02574; H03H 9/02992; H03H 9/02559; H03H 9/562; H03H 9/133; H03H 9/02133; H03H 9/176
  See application file for complete search history.

(56) References Cited

U.S. PATENT DOCUMENTS

| 10,284,176 | B1 * | 5/2019 | Solal | ......................... H03H 3/08 |
| 11,646,713 | B2 * | 5/2023 | Suzuki | ..................... H03H 9/64 |
| | | | | 333/193 |

(Continued)

FOREIGN PATENT DOCUMENTS

| JP | 2017538365 A | 12/2017 |
| JP | 2019080093 A | 5/2019 |
| WO | 2012157101 A1 | 11/2012 |

OTHER PUBLICATIONS

International Search Report in PCT/JP2021/030311, mailed Oct. 12, 2021, 3 pages.

(Continued)

*Primary Examiner* — J. San Martin
(74) *Attorney, Agent, or Firm* — Keating & Bennett, LLP

(57) ABSTRACT

An acoustic wave device including an IDT electrode on a piezoelectric film, in which a Z-axis direction of a crystal is different from a direction of a normal to a major surface. An overlap region of the IDT electrode includes a central region and first and second edge regions. First and second dielectric films are stacked between the piezoelectric film and first and second electrode fingers in the first and second edge regions. When an angle between a first side surface of the first dielectric film and a major surface of the piezoelectric film is $\alpha 1$ and an angle between a second side surface of the second dielectric film and the major surface of the piezoelectric film is $\alpha 2$, $\alpha 1 \neq \alpha 2$ between at least one electrode finger of the first and second electrode fingers and the piezoelectric film.

19 Claims, 13 Drawing Sheets

(51) Int. Cl.
    *H03H 9/13*        (2006.01)
    *H03H 9/56*        (2006.01)

(56)                 References Cited

U.S. PATENT DOCUMENTS

| | | | |
|---|---|---|---|
| 12,413,196 B2 * | 9/2025 | McHugh | H03H 9/562 |
| 12,425,003 B2 * | 9/2025 | Taniguchi | H03H 9/14532 |
| 12,519,452 B2 * | 1/2026 | Michigami | H03H 9/13 |
| 2013/0106536 A1 | 5/2013 | Miura et al. | |
| 2017/0155373 A1 | 6/2017 | Ruby et al. | |
| 2017/0324394 A1 | 11/2017 | Ebner et al. | |
| 2019/0123713 A1 | 4/2019 | Daimon | |
| 2023/0071909 A1 * | 3/2023 | Daimon | H03H 9/02574 |
| 2023/0223912 A1 * | 7/2023 | Daimon | H03H 9/02086 |
| | | | 310/365 |

OTHER PUBLICATIONS

Written Opinion in PCT/JP2021/030311, mailed Oct. 12, 2021, 3 pages.

\* cited by examiner

FIG. 10

FIG. 14
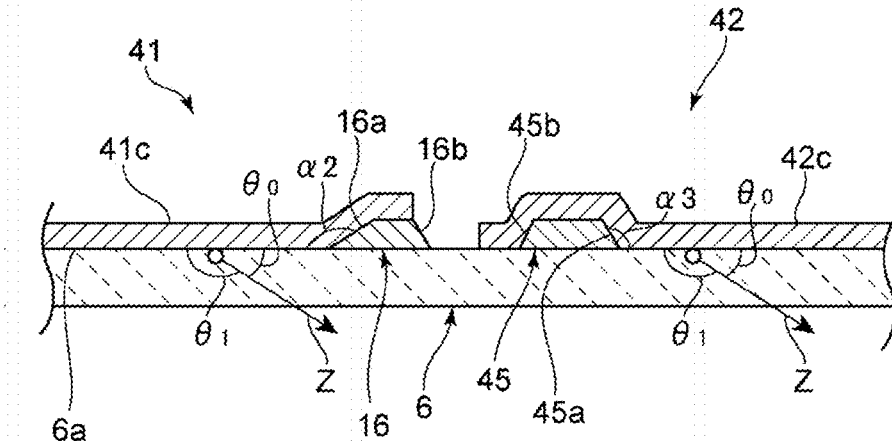
FIG. 15
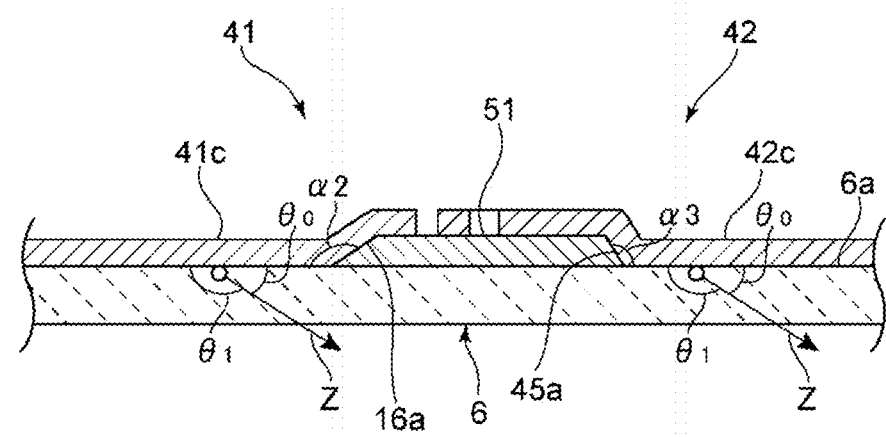
FIG. 16

ACOUSTIC WAVE DEVICE

CROSS REFERENCE TO RELATED APPLICATIONS

This application claims the benefit of priority to Japanese Patent Application No. 2020-138818 filed on Aug. 19, 2020 and is a Continuation Application of PCT Application No. PCT/JP2021/030311 filed on Aug. 19, 2021. The entire contents of each application are hereby incorporated herein by reference.

BACKGROUND OF THE INVENTION

1. Field of the Invention

The present invention relates to an acoustic wave device that is used for a resonator, a band pass filter, or the like.

2. Description of the Related Art

Hitherto, various acoustic wave devices utilizing piston modes have been proposed to prevent transverse mode ripples. For example, in an acoustic wave device described in Japanese Unexamined Patent Application Publication No. 2019-80093, low acoustic velocity regions are formed with the dielectric films stacked between the electrode fingers and the piezoelectric substrate. The region in which the plurality of first electrode fingers and the plurality of second electrode fingers are overlapped with each other as seen from the acoustic wave propagation direction is an overlap region. The low acoustic velocity region is provided in each outer side portion of the central region of the overlap region in the direction in which the first and second electrode fingers extend. In the low acoustic velocity region, the dielectric films are stacked between the first and second electrode fingers and the piezoelectric film. Then, an acoustic velocity in the outer side portion of the low acoustic velocity region described above is high. With the acoustic velocity relationship described above, piston modes are obtained.

SUMMARY OF THE INVENTION

In acoustic wave devices like the one described in Japanese Unexamined Patent Application Publication No. 2019-80093, a piezoelectric single crystal such as $LiTaO_3$ is used as the piezoelectric film. At this time, the Z-axis direction of the crystal is different from the direction of the normal to the major surface of the piezoelectric substrate in many cases. In such a case, while ripples due to transverse modes are prevented, the characteristics of the acoustic wave device are degraded in some cases.

Preferred embodiments of the present invention provide acoustic wave devices each having characteristics that are difficult to degrade.

An acoustic wave device according to a preferred embodiment of the present invention includes a piezoelectric film in which a Z-axis direction of a crystal is different from a direction of a normal to a major surface, and an IDT electrode on the major surface of the piezoelectric film. The IDT electrode includes first and second busbars, a plurality of first electrode fingers connected to the first busbar, and a plurality of second electrode fingers connected to the second busbar. The plurality of first electrode fingers and the plurality of second electrode fingers are interdigitated with each other. A region in which the first electrode fingers and the second electrode fingers are overlapped with each other in a direction in which an acoustic wave is propagated is an overlap region. The overlap region includes a central region, a first edge region located on a first busbar side of the central region in a direction in which the first and second electrode fingers extend, and a second edge region located on a second busbar side of the central region in the direction in which the first and second electrode fingers extend. The acoustic wave device further includes, in the first and second edge regions, first and second dielectric films each located between the major surface of the piezoelectric film and the first and second electrode fingers. The first dielectric film includes, in the first edge region, a first side surface located on the second busbar side. The second dielectric film includes, in the second edge region, a second side surface located on the first busbar side. When an angle between the first side surface and the major surface of the piezoelectric film is denoted by $\alpha 1$ and an angle between the second side surface and the major surface of the piezoelectric film is denoted by $\alpha 2$, $\alpha 1 \neq \alpha 2$ is satisfied between at least one electrode finger of the plurality of first and second electrode fingers and the piezoelectric film.

According to preferred embodiments of the present invention, it is possible to provide acoustic wave devices having characteristics that are difficult to degrade.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a plan view illustrating an IDT electrode of an acoustic wave device according to a third preferred embodiment of the present invention.

FIG. 14 is a side sectional view for explaining the angles α2 and α3 defined by second and third side surfaces and the major surface of a piezoelectric film in the acoustic wave device according to the fifth preferred embodiment of the present invention.

FIG. 15 is a side sectional view for explaining the angles α2 and α3 defined by the second and third side surfaces of second and third dielectric films and the major surface of a piezoelectric film in an acoustic wave device according to a modification of the fourth preferred embodiment of the present invention.

FIG. 16 is a side sectional view for explaining the angles α2 and α3 defined by second and third side surfaces and the major surface of a piezoelectric film in an acoustic wave device according to a modification of the fifth preferred embodiment of the present invention.

DETAILED DESCRIPTION OF THE PREFERRED EMBODIMENTS

Now, specific preferred embodiments of the present invention are described with reference to the drawings to clarify the present invention.

Note that, each preferred embodiment described herein is exemplary and components of different preferred embodiments can be partially replaced or combined.

Figures 1A, 1B, 1C:
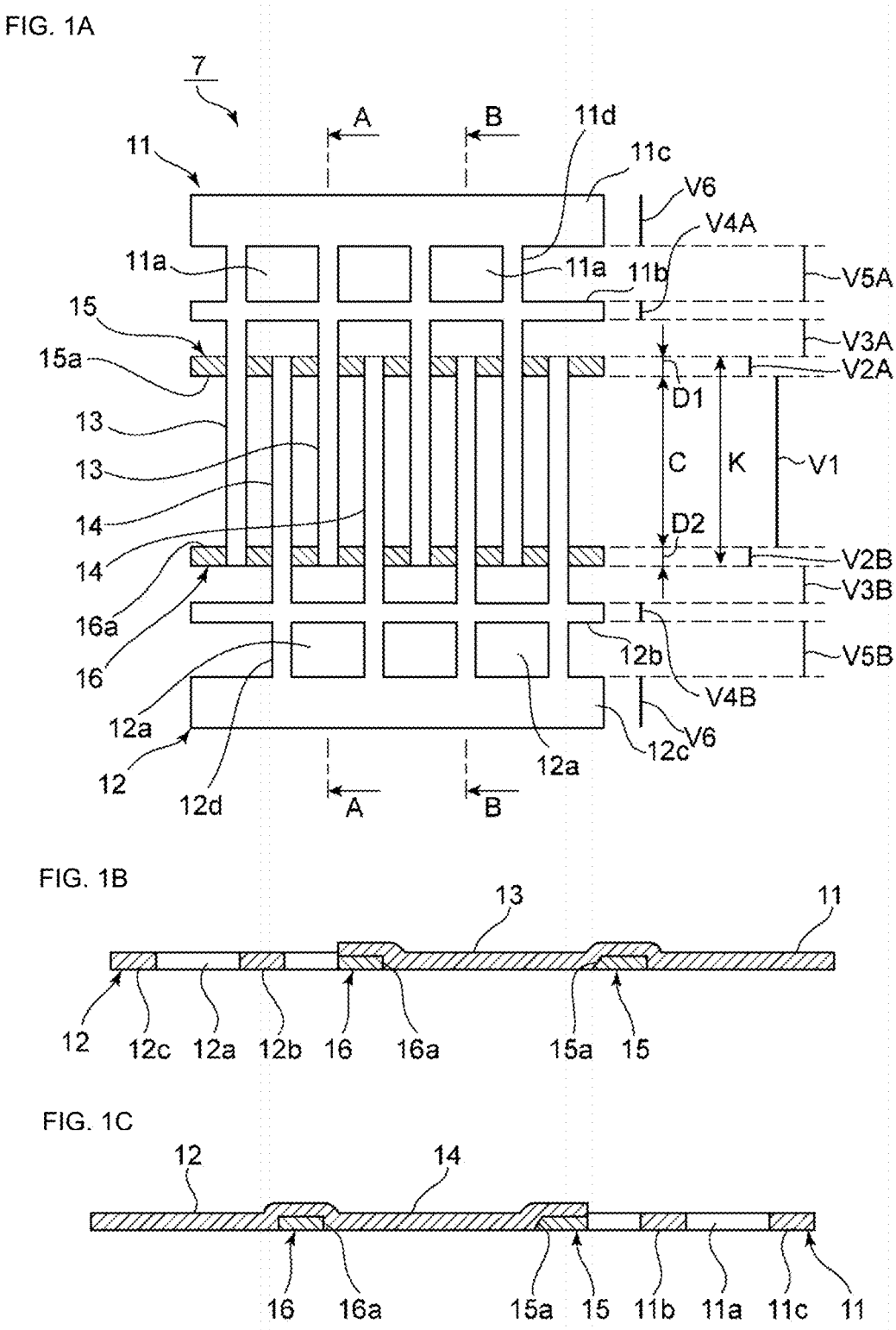
FIG. 1A is a plan view illustrating an IDT electrode of an acoustic wave device according to a first preferred embodiment of the present invention.
FIG. 1B is a sectional view taken along the line A-A of FIG. A.
FIG. 1C is a sectional view taken along the line B-B of FIG. 1A.
Figures 2, 3:
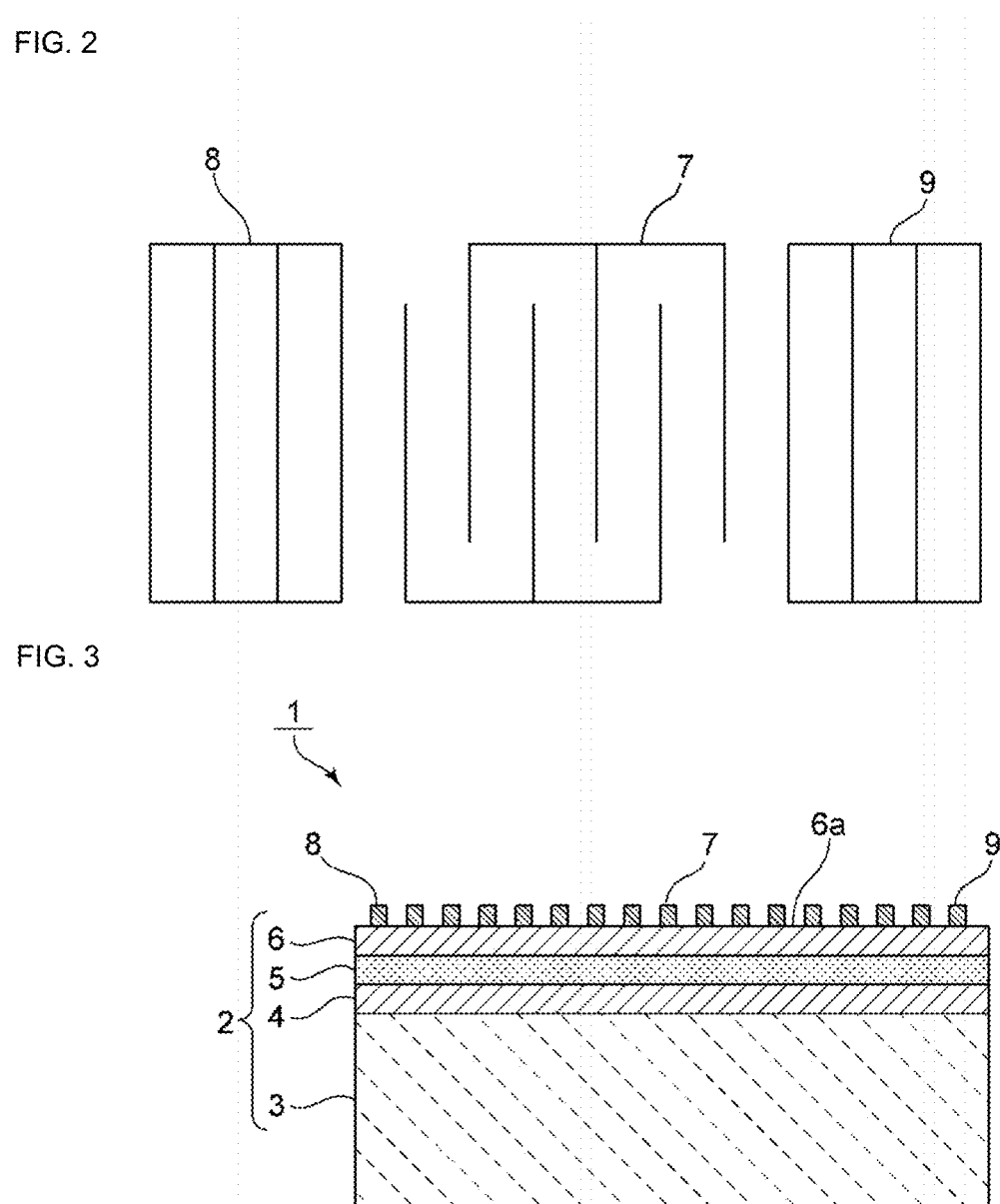
FIG. 2 is a plan view schematically illustrating the electrode structure of the acoustic wave device of the first preferred embodiment of the present invention.
FIG. 3 is a front sectional view of the acoustic wave device according to the first preferred embodiment of the present invention.

FIG. 1A is a plan view illustrating an IDT electrode of an acoustic wave device according to a first preferred embodiment of the present invention, and FIGS. 1B and 1C are sectional views taken along the line A-A and the line B-B of FIG. 1A. FIG. 3 is a front sectional view of the acoustic wave device according to the first preferred embodiment.

As illustrated in FIG. 3, an acoustic wave device 1 includes a piezoelectric substrate 2. In the piezoelectric substrate 2, on a support substrate 3, a high acoustic velocity material layer 4, a low acoustic velocity material layer 5, and a piezoelectric film 6 are stacked in this order.

The piezoelectric film 6 of the present preferred embodiment is made of lithium tantalate. However, the piezoelectric film 6 may be made of another piezoelectric single crystal such as lithium niobate. In a preferred embodiment of the present invention, the Z-axis direction of the crystal of the piezoelectric film 6 is a direction offset from the direction of the normal to a major surface 6a of the piezoelectric film 6. That is, the Z-axis direction of the crystal of the piezoelectric film is different from the direction of the normal to the major surface.

An IDT electrode 7 and reflectors 8 and 9 are provided on the piezoelectric film 6. FIG. 2 is a schematic plan view illustrating this electrode structure. The reflectors 8 and 9 are provided on the respective sides in the acoustic wave propagation direction of the IDT electrode 7. With this, a single-port acoustic wave resonator is configured.

As illustrated in FIG. 1A, the IDT electrode 7 includes a first busbar 11 and a second busbar 12 separated from the first busbar 11.

A plurality of first electrode fingers 13 are connected to the first busbar 11. A plurality of second electrode fingers 14 are connected to the second busbar 12. The plurality of first electrode fingers 13 and the plurality of second electrode fingers 14 are interdigitated with each other.

The acoustic wave propagation direction is a direction orthogonal to the direction in which the first and second electrode fingers 13 and 14 extend. The region in which the first electrode fingers 13 and the second electrode fingers 14 are overlapped with each other as seen from the acoustic wave propagation direction is an overlap region K. The overlap region K includes a central region C and first and second edge regions D1 and D2. The first edge region D1 is a region located on the first busbar 11 side of the central region C in the direction in which the first and second electrode fingers 13 and 14 extend. The second edge region D2 is a region located on the second busbar 12 side of the central region C in the direction in which the first and second electrode fingers 13 and 14 extend. Then, the first and second edge regions in question are low acoustic velocity regions with acoustic wave acoustic velocities lower than that in the central region.

Note that, the overlap region K may include regions other than the central region C and the first and second edge regions D1 and D2. For example, there may be some other regions in the outer side portions of the first and second edge regions D1 and D2.

As illustrated in FIGS. 1A to 1C, in the first edge region D1, a first dielectric film 15 is stacked between the first and second electrode fingers 13 and 14 and the piezoelectric film. Further, in the second edge region D2, a second dielectric film 16 is stacked between the first and second electrode fingers 13 and 14 and the piezoelectric film. Further, the first dielectric film 15 and the second dielectric film 16 are provided to also reach the regions between the first electrode fingers 13 and the second electrode fingers 14. The first dielectric film 15 and the second dielectric film 16 have a strip shape extending in the acoustic wave propagation direction. A dielectric material for the first and second dielectric films 15 and 16 is not particularly limited and can be, for example, silicon oxide, tantalum oxide, hafnium oxide, tungsten oxide, selenium oxide, or niobium oxide. In the present preferred embodiment, tantalum oxide is used.

Acoustic velocities in the respective regions of the acoustic wave device 1 are as described in the acoustic velocity scale in the right portion of FIG. 1A. In the right portion of FIG. 1A, the acoustic velocity increases toward the right.

With the first and second dielectric films 15 and 16, acoustic velocities V2A and V2B in the first and second edge regions D1 and D2 are lower than an acoustic velocity V1 in the central region C. Meanwhile, acoustic velocities in the regions of the outer side portion of the first edge region D1 and the outer side portion of the second edge region D2, that is, an acoustic velocity in the region between the first edge region D1 and the first busbar 11 and an acoustic velocity in the region between the second edge region D2 and the second busbar 12 are V3A and V3B, respectively. That is, the regions are high acoustic velocity regions with acoustic velocities higher than the acoustic velocities V2A and V2B in the first and second edge regions D1 and D2. Further, in the outer side portion of the first edge region D1, high acoustic velocity regions with the acoustic velocity V3A, an acoustic velocity V4A, and an acoustic velocity V5A are provided. In the outer side portion of the second edge region D2, high acoustic velocity regions with the acoustic velocity V3B, an acoustic velocity V4B, and an acoustic velocity V5B are provided. With this acoustic velocity relationship, as in the related-art acoustic wave device, transverse mode ripples are prevented by utilizing piston modes.

The first dielectric film 15 includes a first side surface 15a located on the second busbar 12 side. Meanwhile, the second dielectric film 16 includes a second side surface 16a located on the first busbar 11 side. In the present preferred embodiment, the first side surface 15a and the second side surface 16a extend along the acoustic wave propagation direction.

The first and second dielectric films 15 and 16 extend in the acoustic wave propagation direction to also reach the regions between the first and second electrode fingers 13 and 14. However, in a preferred embodiment of the present invention, the first and second dielectric films 15 and 16 are not necessarily provided in the regions between the first electrode fingers 13 and the second electrode fingers 14 and may be provided only under the first and second electrode fingers 13 and 14.

Figure 4:
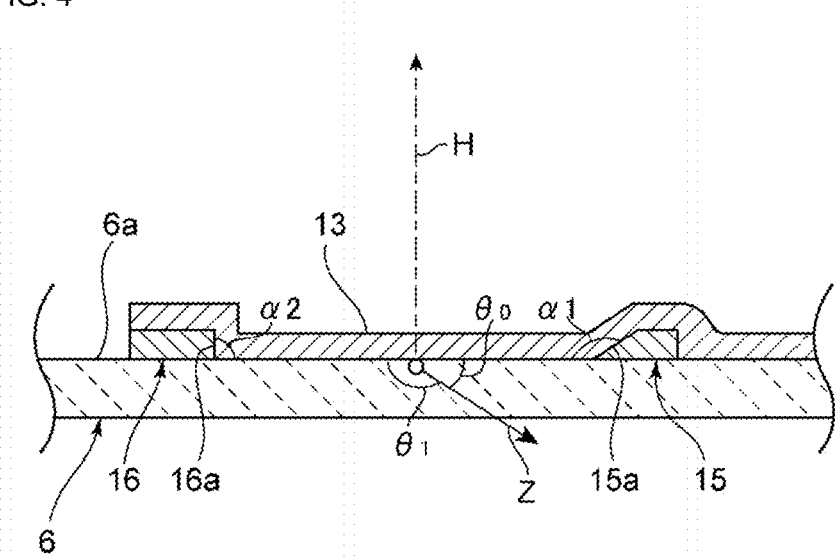
FIG. 4 is a schematic side sectional view for explaining angles $\alpha 1$ and $\alpha 2$ defined by the first and second side surfaces of first and second dielectric films and the major surface of a piezoelectric film.

As illustrated in the schematic side sectional view of FIG. 4, one of the unique features of the acoustic wave device 1 is that an angle α1 defined by the first side surface 15a and the major surface 6a of the piezoelectric film 6 and an angle α2 defined by the second side surface 16a and the major surface 6a of the piezoelectric film 6 have α1≠α2. More specifically, α1>α2 is satisfied. With this, the degradation of characteristics can be prevented. This is described in detail below.

FIG. 4 is a schematic side sectional view of a cross section taken along the direction in which the first electrode fingers 13 extend. As illustrated in FIG. 4, in the piezoelectric film 6, in the cross section taken along the direction in which the first electrode fingers 13 extend, the Z axis of the crystal of the piezoelectric film 6 is different from the direction of a normal H to the major surface 6a of the piezoelectric film 6. When such a piezoelectric film 6 is used in the related-art acoustic wave device, the characteristics are degraded in some cases.

Here, the characteristics are difficult to degrade since α1≠α2 is satisfied. This is because different levels of stress are applied to portions of the piezoelectric film 6 near the first side surface 15a and near the second side surface 16a, which means that the stress concentration is reduced. Thus, polarization reversal or the like is difficult to occur during excitation and the characteristics are thus difficult to degrade. Note that, it is only necessary that α1≠α2 is satisfied between at least one electrode finger of the plurality of first and second electrode fingers 13 and 14 and the piezoelectric film 6. However, α1≠α2 preferably is satisfied between each of the plurality of first and second electrode fingers 13 and 14 and the piezoelectric film 6.

As illustrated in FIG. 4, here, an angle $\theta_0$ defined by the Z axis and the major surface 6a of the piezoelectric film 6 is smaller than $\theta_1$. The first side surface 15a is located on the side on which the Z axis and the major surface 6a of the piezoelectric film 6 form the smaller angle. Then, since α1>α2 is satisfied, the concentration of stress can be prevented more effectively so that the degradation of characteristics can be prevented more effectively.

Figure 6:
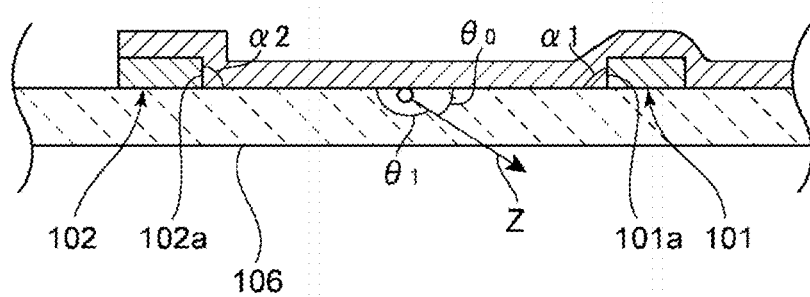
FIG. 6 is a schematic side sectional view for explaining a relationship between angles defined by the side surfaces of dielectric films and the major surface of a piezoelectric film and angles defined by the Z-axis direction of the crystal of the piezoelectric film and the major surface of the piezoelectric film in a related-art acoustic wave device.
Figures 7, 8:
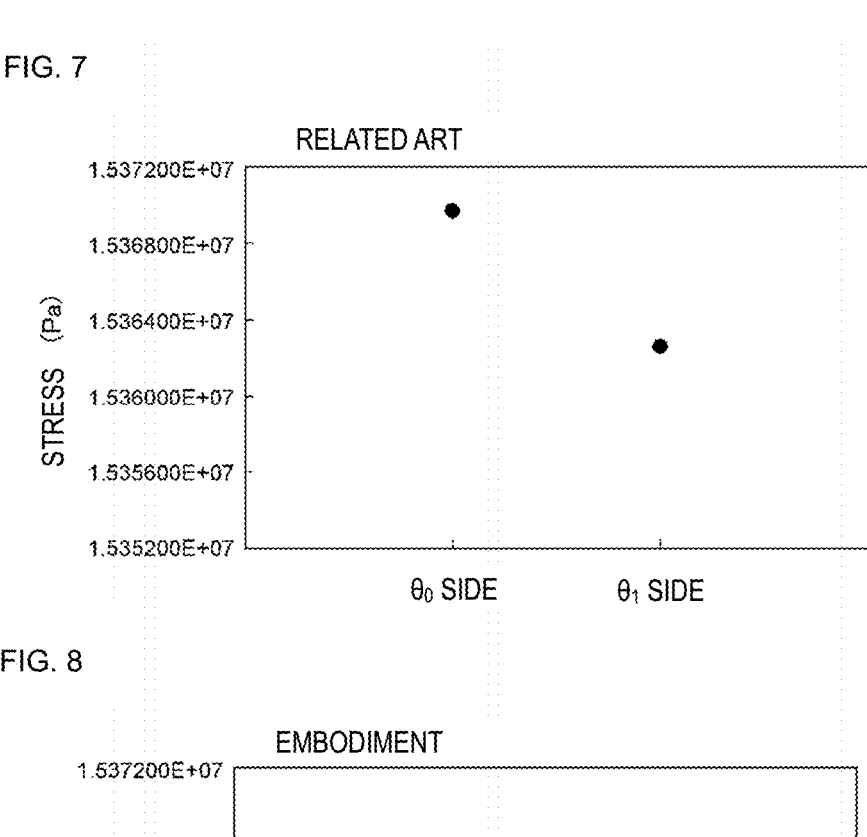
FIG. 7 is a diagram illustrating a level of stress on an angle $\theta_1$ side and a level of stress on an angle $\theta_0$ side in the related-art acoustic wave device illustrated in FIG. 6.
FIG. 8 is a diagram illustrating levels of stress on the angle $\theta_1$ side and the angle $\theta_0$ side in the first preferred embodiment of the present invention.

FIG. 6 is a schematic side sectional view for explaining a relationship between angles defined by the side surfaces of dielectric films and the major surface of a piezoelectric film and angles defined by the Z-axis direction of the crystal of the piezoelectric film and the major surface of the piezoelectric film in a related-art acoustic wave device. In the related-art acoustic wave device, the angles α1 and α2 defined by first and second side surfaces 101a and 102a of first and second dielectric films 101 and 102 and the major surface of a piezoelectric film 106 have α1=α2. In this case, when an AC voltage is applied to the acoustic wave device to drive the acoustic wave device, a stress distribution occurs. That is, in FIG. 6, when a smaller one of angles defined by the Z axis and the major surface of the piezoelectric film 106 is denoted by $\theta_0$ and a larger one thereof is denoted by $\theta_1$, as illustrated in FIG. 7, stress on the $\theta_0$ side is larger than stress on the $\theta_1$ side. It is conceivable that this imbalance of stress causes polarization reversal, resulting in the degradation of characteristics.

In contrast to this, in the present preferred embodiment, as illustrated in FIG. 8, stress on the $\theta_0$ side is almost the same as stress on the $\theta_1$ side. This is because α1>α2 is satisfied and hence less stress is applied on the $\theta_0$ side. With this, polarization reversal is difficult to occur and the characteristics are thus difficult to degrade. Note that, when the second side surface 16a is located on the side on which the Z axis and the major surface 6a of the piezoelectric film 6 define the smaller angle in the piezoelectric film 6, it is only necessary that α2>α1 hold.

Returning to FIG. 1A, in the first preferred embodiment, the first and second busbars 11 and 12 include a plurality of openings 11a and 12a positioned along the acoustic wave propagation direction. Then, an inner busbar portion 11b is provided on the overlap region K side of the opening 11a, and an outer busbar portion 11c is provided on the outer side of the opening 11a. The inner busbar portion 11b and the outer busbar portion 11c are connected to each other by a connection portion 11d. Similarly, the second busbar 12 includes an inner busbar portion 12b, an outer busbar portion 12c, and a connection portion 12d. With the plurality of openings 11a and 12a described above, in the first and second busbars 11 and 12, acoustic velocities in the regions in which the openings 11a and 12a are located are high.

The IDT electrode 7 and the reflectors 8 and 9, which are described above, are made of an appropriate metal or alloy. In this case, the IDT electrode 7 and the reflectors 8 and 9 may each include a film stack including a plurality of metal films.

Further, a material for the support substrate 3 illustrated in FIG. 3 is not particularly limited and can be, for example, a semiconductor such as silicon or a dielectric such as alumina.

A high acoustic velocity material for the high acoustic velocity material layer 4 is not particularly limited and can be silicon, aluminum oxide, silicon carbide, sapphire, lithium tantalate, lithium niobate, quartz, alumina, zirconia, cordierite, mullite, steatite, forsterite, magnesia, a diamond-like carbon (DLC) film, or diamond, or a material containing the above-mentioned materials as its main components. Further, at least one kind of material selected from the group consisting of aluminum nitride, aluminum oxide, silicon nitride, and DLC is preferably used.

A low acoustic velocity material for the low acoustic velocity material layer 5 is not particularly limited and can be silicon oxide, silicon oxynitride, tantalum oxide, glass, or a compound containing silicon oxide and fluorine, carbon, or boron. Further, the low acoustic velocity material described above may be a material containing the above-mentioned materials as its main components.

Note that, a high acoustic velocity material indicates a material through which a bulk wave is propagated at an acoustic velocity higher than an acoustic velocity at which an acoustic wave is propagated through the piezoelectric film 6, and a low acoustic velocity material indicates a material through which a bulk wave is propagated at an acoustic velocity lower than an acoustic velocity at which a bulk wave is propagated through the piezoelectric film 6. Since having the stack structure described above, the piezoelectric substrate 2 can effectively confine an acoustic wave in the piezoelectric film 6.

As described above, in the acoustic wave device 1, while transverse mode ripples can be prevented, even when the Z axis of the piezoelectric film 6 is offset from the normal H to the major surface 6a of the piezoelectric film 6, polarization reversal is difficult to occur and the characteristics are thus difficult to degrade.

Figure 5:
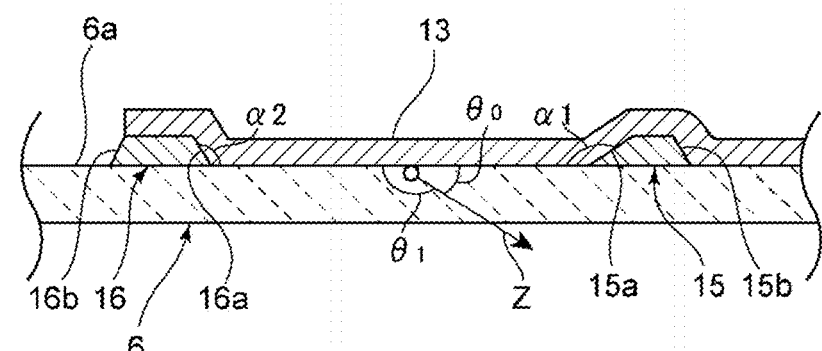
FIG. 5 is a schematic side sectional view for explaining the angles $\alpha 1$ and $\alpha 2$ defined by the first and second side surfaces of first and second dielectric films and the major surface of a piezoelectric film in a modification of the first preferred embodiment of the present invention.

FIG. 5 is a schematic side sectional view for explaining the angles α1 and α2 defined by the first and second side surfaces of first and second dielectric films and the major surface of a piezoelectric film in a modification of the first preferred embodiment. As illustrated in FIG. 5, the first side surface 15a and an opposite side surface 15b of the first dielectric film 15 do not necessarily extend in the direction of the normal to the major surface 6a of the piezoelectric film 6 and may be inclined surfaces. Similarly, the second side surface 16a and an opposite side surface 16b of the second dielectric film 16 may be inclined surfaces. In this case, angles between the opposite side surfaces 15b and 16b and the major surface 6a of the piezoelectric film 6 are not particularly limited.

Figure 9:
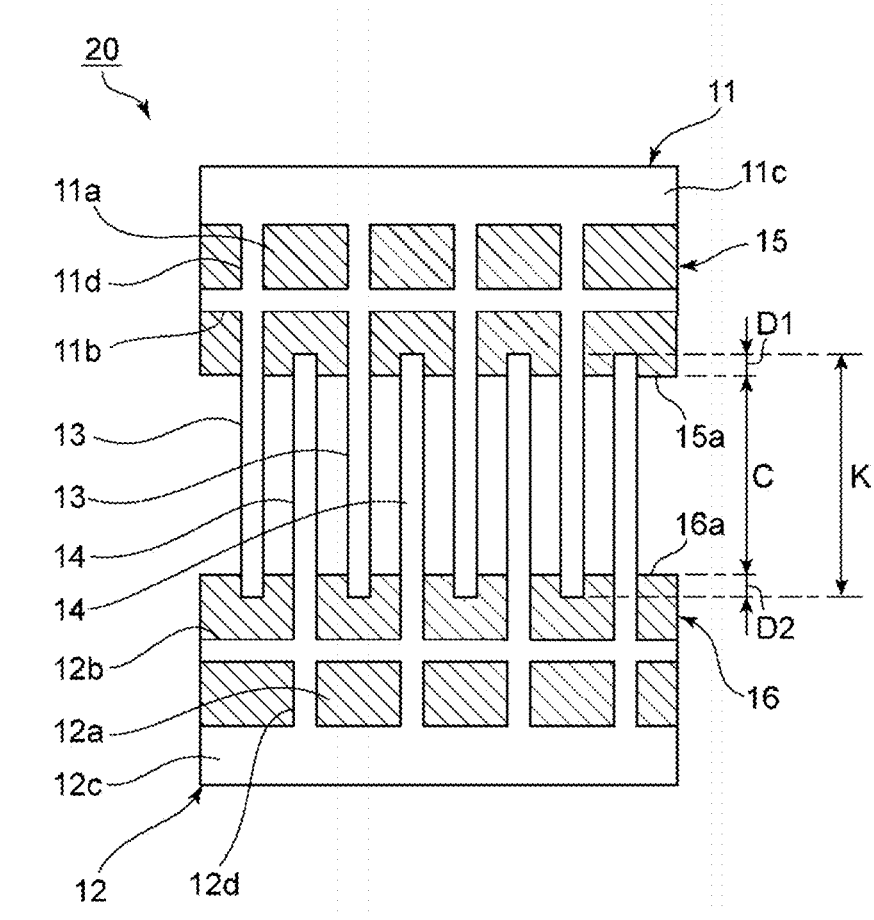
FIG. 9 is a plan view for explaining an IDT electrode of an acoustic wave device according to a second preferred embodiment of the present invention.

FIG. 9 is a plan view illustrating an IDT electrode of an acoustic wave device according to a second preferred embodiment of the present invention. In an IDT electrode 20 of the acoustic wave device of the second preferred embodiment, the first dielectric film 15 further extends from the first edge region D1 toward the opposite side of the central region C in the direction in which the first and second electrode fingers 13 and 14 extend. That is, the first dielectric film 15 extends to reach the lower surface of the outer busbar portion 11c of the first busbar 11. Similarly, the second dielectric film 16 extends outward in the direction in which the first and second electrode fingers 13 and 14 extend to reach the lower surface of the outer busbar portion 12c of the second busbar 12. In this way, the first and second dielectric films 15 and 16 may extend outward with respect to the first and second edge regions D1 and D2 in the direction in which the first and second electrode fingers 13 and 14 extend. With this, the first and second dielectric films 15 and 16 can be easily positioned when being formed.

Note that, when reaching the outer side portions of the first and second edge regions D1 and D2, the first dielectric film 15 and the second dielectric film 16 do not necessarily reach the lower surfaces of the outer busbar portions 11c and 12c.

Also in the second preferred embodiment, since the remaining configuration is similar to that of the acoustic wave device 1 of the first preferred embodiment, transverse mode ripples can be prevented and the characteristics of the acoustic wave device are difficult to degrade.

Figure 10:
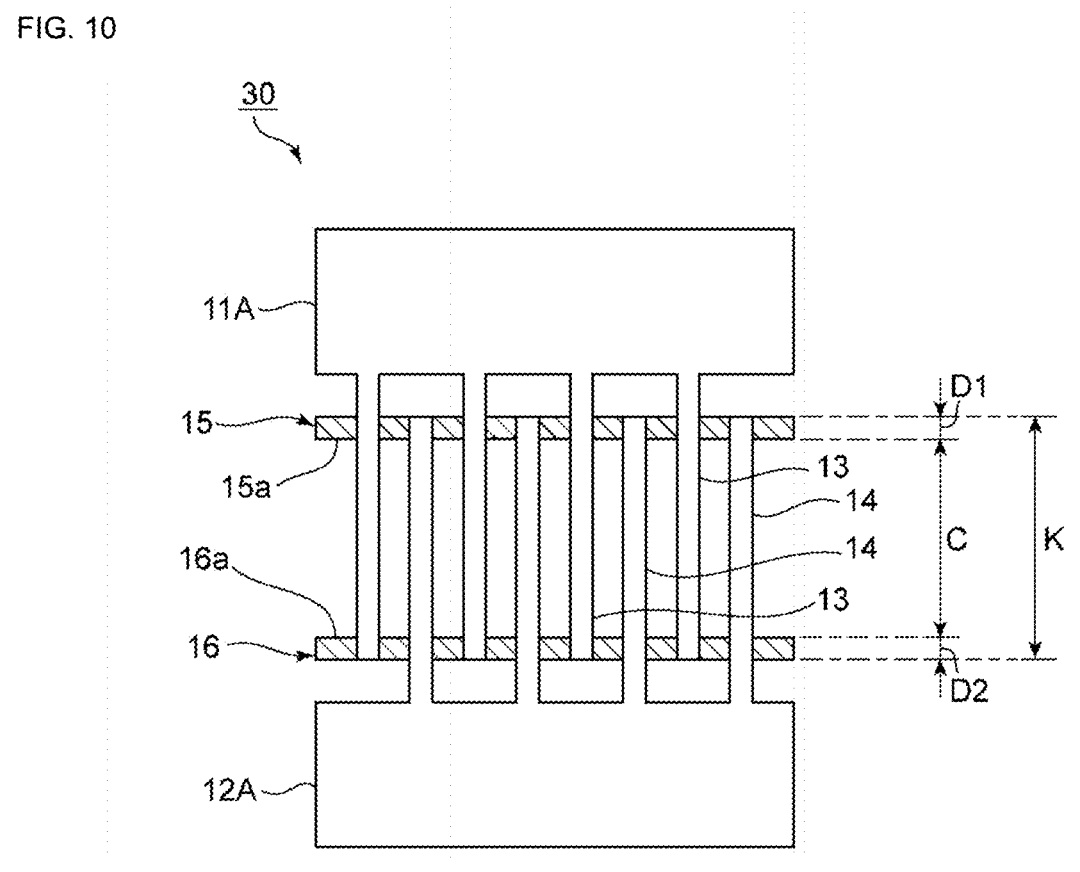

FIG. 10 is a plan view illustrating an IDT electrode of an acoustic wave device according to a third preferred embodiment of the present invention. In an IDT electrode 30 of the acoustic wave device of the third preferred embodiment, a first busbar 11A and a second busbar 12A are used. The first busbar 11A and the second busbar 12A each include a single strip-shaped metal film extending in the acoustic wave propagation direction. In this way, in a preferred embodiment of the present invention, the first and second busbars may each include a single strip-shaped metal film without the openings 11a and 12a of FIG. 1A.

Also in the present preferred embodiment, in the outer side portions of the first and second edge regions D1 and D2, the gap regions between the first and second edge regions D1 and D2 and the first and second busbars 11A and 12A are high acoustic velocity regions. Thus, transverse mode ripples can be prevented by virtue of the acoustic velocity difference.

Further, the remaining configuration of the third preferred embodiment is similar to that of the first preferred embodiment except that the first and second busbars 11A and 12A do not have the openings 11a and 12a of FIG. 1A, and the characteristics of the acoustic wave device are thus difficult to degrade due to polarization reversal.

Figure 11:
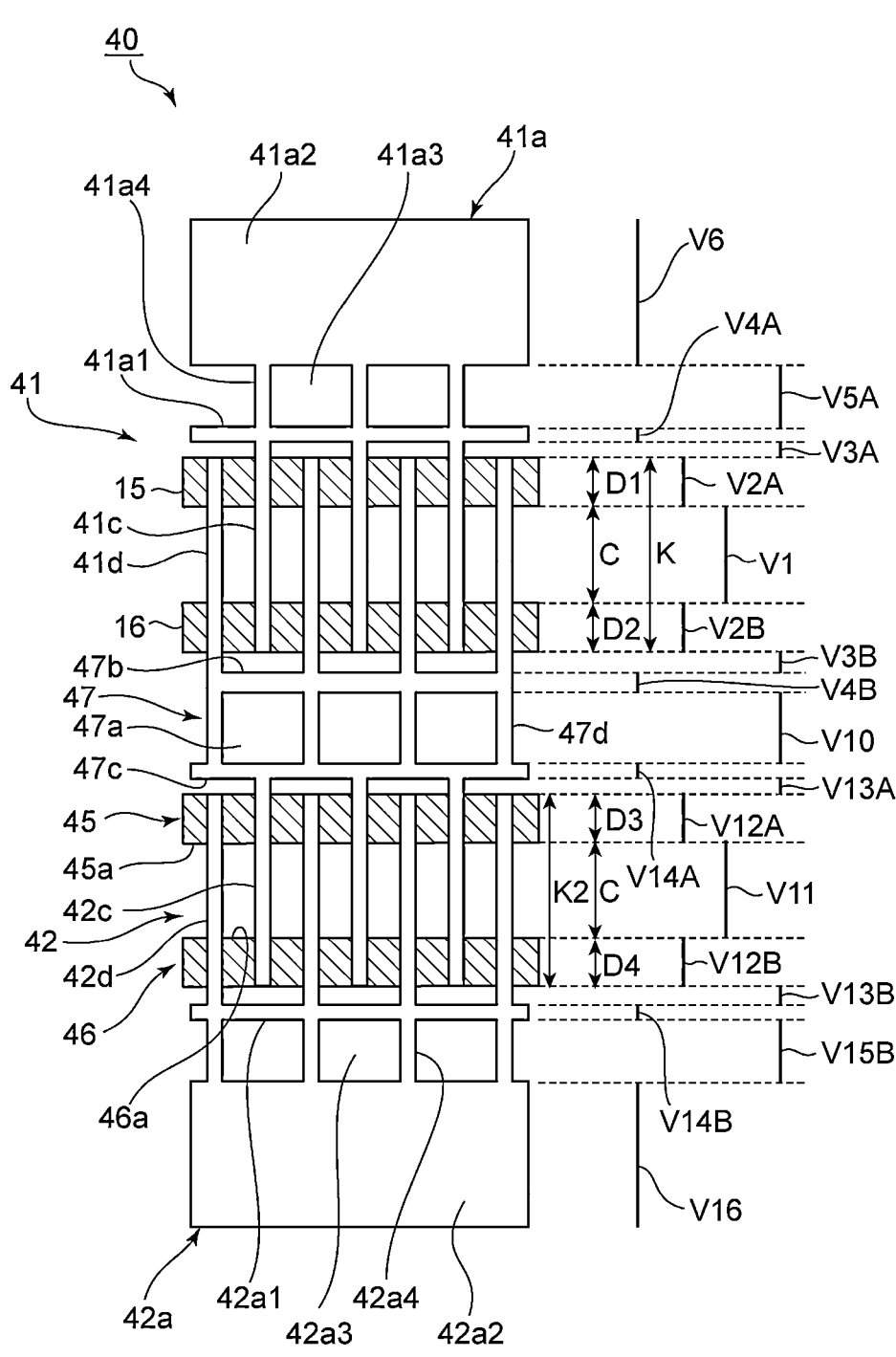
FIG. 11 is a plan view illustrating an IDT electrode of an acoustic wave device according to a fourth preferred embodiment of the present invention.

FIG. 11 is a plan view for explaining an IDT electrode of an acoustic wave device according to a fourth preferred embodiment.

An acoustic wave device 40 of the fourth preferred embodiment includes a first IDT electrode 41 and a second IDT electrode 42. The first IDT electrode 41 and the second IDT electrode 42 are connected to each other with a common busbar 47 interposed therebetween.

The first IDT electrode 41 includes a first busbar 41a and the common busbar 47. The first busbar 41a includes an inner busbar portion 41a1 and an outer busbar portion 41a2. Further, a plurality of openings 41a3 are positioned along the acoustic wave propagation direction. The inner busbar portion 41a1 and the outer busbar portion 41a2 are connected to each other by a connection portion 41a4. Meanwhile, the common busbar 47 includes a plurality of openings 47a positioned along the acoustic wave propagation direction. A first busbar portion 47b is provided on the first IDT electrode 41 side of the plurality of openings 47a. A second busbar portion 47c is provided on the second IDT electrode 42 side of the openings 47a. The first busbar portion 47b and the second busbar portion 47c are connected to each other by a connection portion 47d.

A plurality of first electrode fingers 41c are connected to the first busbar 41a. A plurality of second electrode fingers 41d are connected to the first busbar portion 47b of the common busbar 47. The plurality of first electrode fingers 41c and the plurality of second electrode fingers 41d are interdigitated with each other.

Meanwhile, in the second IDT electrode 42, a plurality of third electrode fingers 42c are connected to the second busbar portion 47c of the common busbar 47. A plurality of fourth electrode fingers 42d are connected to a fourth busbar 42a. The plurality of third electrode fingers 42c and the plurality of fourth electrode fingers 42d are interdigitated with each other.

The fourth busbar 42a has, like the first busbar 41a of the first IDT electrode 41, openings 42a3, an inner busbar portion 42a1, an outer busbar portion 42a2, and a connection portion 42a4.

As described above, the first IDT electrode 41 and the second IDT electrode 42 are connected to each other by the common busbar 47. Here, the first busbar portion 47b of the common busbar 47 corresponds to a second busbar and the second busbar portion 47c corresponds to a third busbar that is one of the busbars of the second IDT electrode 42.

Acoustic velocities in the respective regions of the acoustic wave device 40 are as described in the acoustic velocity scale in the right portion of FIG. 11. That is, in the right portion of FIG. 11, the acoustic velocity increases toward the right. The acoustic velocities V1>V2A=V2B is satisfied, and the acoustic velocity V1 in the central region C is higher than the acoustic velocities V2A and V2B in the first and second edge regions D1 and D2. Then, in the outer side portion of the first edge region D1, high acoustic velocity regions with the acoustic velocity V3A, the acoustic velocity V4A, and the acoustic velocity V5A are provided. Also in the outer side portion of the second edge region D2, high acoustic velocity regions with the acoustic velocity V3B, the acoustic velocity V4B, and an acoustic velocity V10 are provided. Thus, transverse mode ripples can be prevented on the first IDT electrode 41 side.

Also in the second IDT electrode 42, a second overlap region K2 includes the central region C and third and fourth edge regions D3 and D4. In the outer side portions of the central region C with an acoustic velocity V11, the third and fourth edge regions D3 and D4 with an acoustic velocity V12A and an acoustic velocity V12B are provided. Then, in the outer side portion of the third edge region D3 and the outer side portion of the fourth edge region D4, high acoustic velocity regions with an acoustic velocity V13A, an acoustic velocity V14A, and the acoustic velocity V10 and high acoustic velocity regions with an acoustic velocity V13B, an acoustic velocity V14B, and an acoustic velocity V15B are provided, respectively.

Note that, acoustic velocities V6 and V16 are acoustic velocities in the outer busbar portions 41a2 and 42a2.

In the present preferred embodiment, first to fourth dielectric films 15, 16, 45, and 46 are provided in the respective first to fourth edge regions D1 to D4. That is, in the first to fourth edge regions D1 to D4, the respective first to fourth dielectric films 15, 16, 45, and 46 are stacked between the piezoelectric film 6 and the first to fourth electrode fingers 41c, 41d, 42c, and 42d.

The acoustic wave device 40 of the fourth preferred embodiment has, as described above, the structure in which the two second IDT electrodes, namely, the first and second IDT electrodes 41 and 42 are connected to each other and the first to fourth edge regions D1 to D4 are provided.

The third dielectric film 45 and the fourth dielectric film 46, which are described above, are provided like the first dielectric film 15 and the second dielectric film 16 on the first IDT electrode 41 side. Then, the third dielectric film 45 includes a third side surface 45a on the fourth busbar 42a side, and the fourth dielectric film 46 has a fourth side surface 46a on the second busbar portion 47c side of the common busbar 47 corresponding to the third busbar.

In a preferred embodiment of the present invention, it is only necessary that the first, second, third, or fourth side surface of the dielectric film in at least one edge region of the first to fourth edge regions D1 to D4 and the major surface of the piezoelectric film define an angle different from angles defined by the side surfaces of the remaining dielectric films and the major surface of the piezoelectric film. With this, polarization reversal is difficult to occur and the characteristics are thus difficult to degrade.

Figure 12:
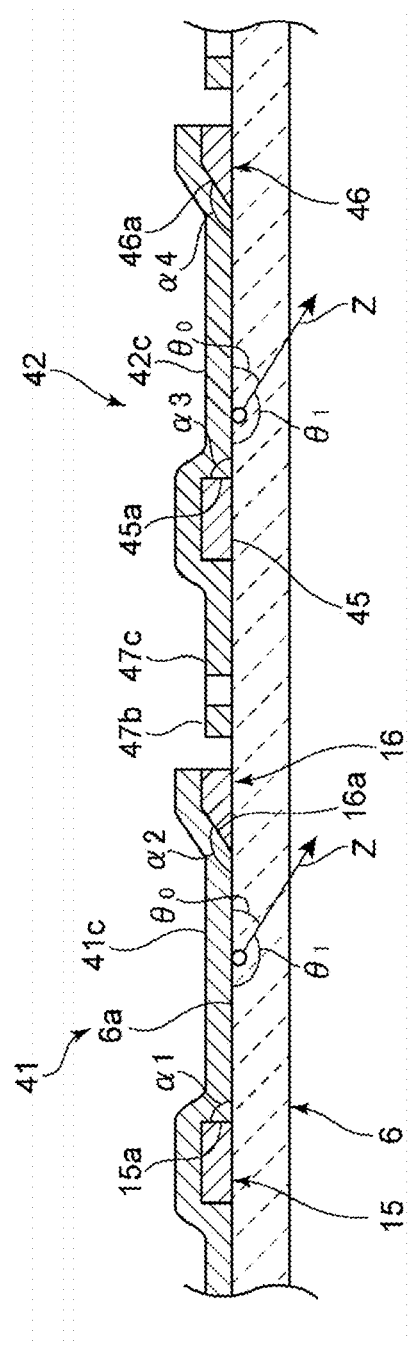
FIG. 12 is a schematic side sectional view for explaining angles α1 to α4 defined by the first to fourth side surfaces of first to fourth dielectric films and the major surface of a piezoelectric film in the acoustic wave device according to the fourth preferred embodiment of the present invention.

FIG. 12 is a schematic side sectional view for explaining the first to fourth side surfaces and angles α1 to α4 in the acoustic wave device according to the fourth preferred embodiment. This side sectional view is a side sectional view taken along the direction in which the first electrode fingers 41c of the first IDT electrode 41 and the third electrode fingers 42c of the second IDT electrode 42 of FIG. 11 extend.

In FIG. 12, the angle α2 defined by the second side surface 16a of the second dielectric film 16 and the major surface 6a of the piezoelectric film 6 and the angle α3 defined by the third side surface 45a of the third dielectric film 45 and the major surface 6a of the piezoelectric film 6 are illustrated. Note that, the fourth side surface 46a of the fourth dielectric film 46 and the major surface 6a of the piezoelectric film 6 define the angle α4.

Further, as in the first preferred embodiment, the first side surface 15a of the first dielectric film 15 and the major surface 6a of the piezoelectric film 6 define the angle α1. Also in this case, the Z axis of the crystal is offset from the normal to the major surface 6a of the piezoelectric film 6. The angles α2 and α4 located on the side on which the Z axis and the major surface 6a of the piezoelectric film 6 define a smaller angle are larger than the angles α1 and α3 located on the side on which the Z axis and the major surface 6a of the piezoelectric film 6 form a larger angle. Although not particularly illustrated, α4>α1 is satisfied. Thus, as in the case of the first preferred embodiment, the characteristics of the acoustic wave device including the first and second IDT electrodes 41 and 42 are difficult to degrade due to polarization reversal.

Figure 13:
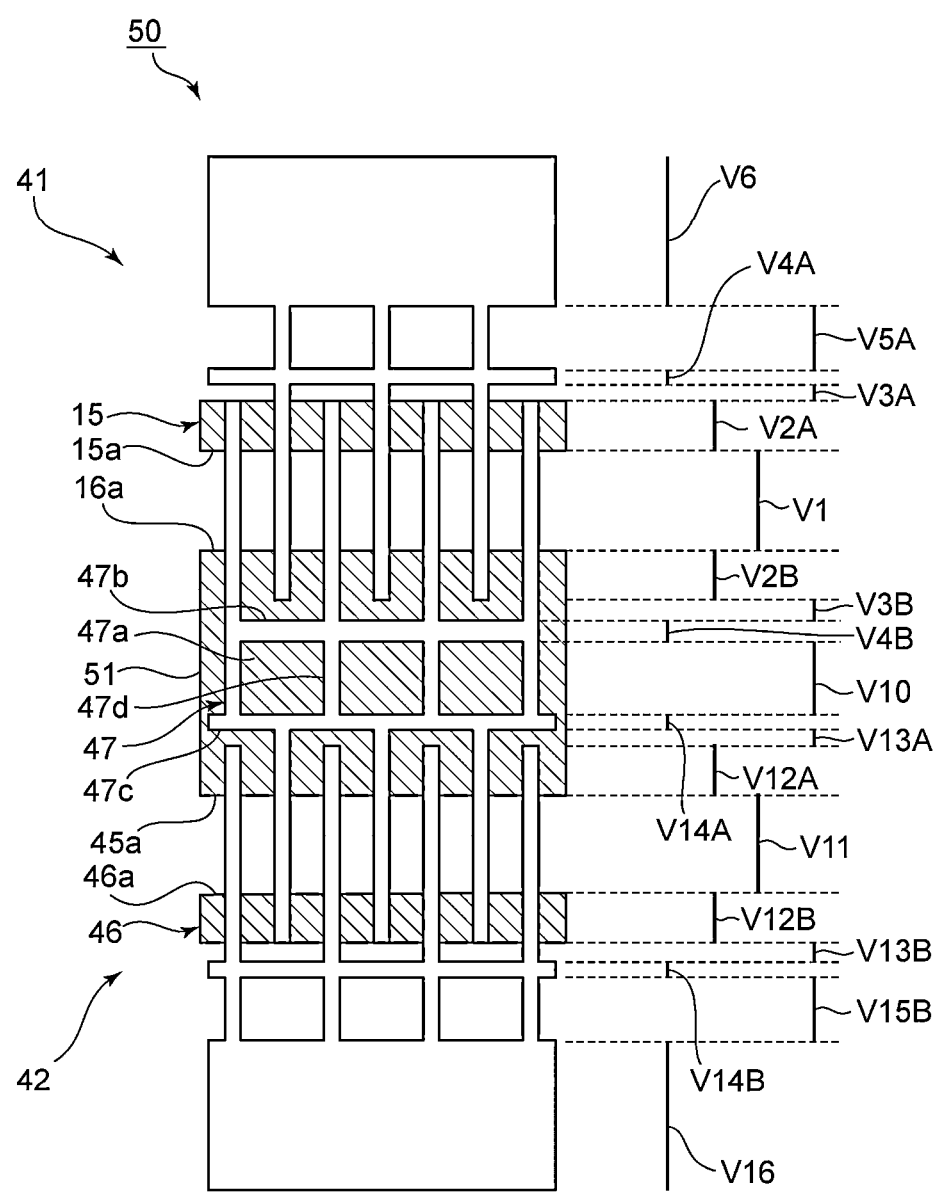
FIG. 13 is a plan view illustrating an IDT electrode of an acoustic wave device according to a fifth preferred embodiment of the present invention.

FIG. 13 is a plan view illustrating an IDT electrode of an acoustic wave device 50 according to a fifth preferred embodiment. The acoustic wave device 50 includes, like the acoustic wave device 40, the first and second IDT electrodes 41 and 42 and has almost the same electrode structure as that of the acoustic wave device 40. The acoustic wave device 50 is different from the acoustic wave device 40 in that a second dielectric film provided on the first IDT electrode 41 side and a third dielectric film provided on the second IDT electrode 42 side are integrated with each other to define and function as a common dielectric film 51. That is, the common dielectric film 51 corresponds to a dielectric film including the second dielectric film extending under the common busbar 47 to be connected to the third dielectric film, and the third dielectric film. Thus, the side surface on the first IDT electrode 41 side of the common dielectric film 51 corresponds to the second side surface 16a and the side surface on the second IDT electrode 42 side thereof corresponds to the third side surface 45a. The remaining structure of the acoustic wave device 50 is similar to that of the acoustic wave device 40.

Note that, the term "under" in the expression "under the common busbar 47" above means, since FIG. 13 is a plan view, a position on the back side in the front-back direction of the drawing sheet of FIG. 13, and the term "above" means a position on the opposite side of the term "under" above.

FIG. 14 is a side sectional view for explaining the angles α2 and α3 defined by the second and third side surfaces 16a and 45a and the major surface 6a of the piezoelectric film 6 in the acoustic wave device 50 according to the fifth preferred embodiment. Also in this case, as in the case of FIG. 12, α2>α3 is satisfied. Thus, as in the fourth preferred embodiment, the characteristics are difficult to degrade due to polarization reversal or the like.

FIG. 15 is a side sectional view for explaining a modification of the acoustic wave device 40 according to the fourth preferred embodiment. Here, the second side surface 16a, the opposite side surface 16b, the third side surface 45a, and an opposite side surface 45b also extend in directions offset from the direction of the normal to the major surface 6a of the piezoelectric film 6, that is, in directions not vertical to but inclined from the major surface 6a. In this way, the second side surface 16a, the opposite side surface 16b, the third side surface 45a, and the opposite side surface 45b may be inclined.

FIG. 16 is a side sectional view for explaining the angles α2 and α3 in an acoustic wave device according to a modification of the fifth preferred embodiment.

As illustrated in FIG. 16, the third side surface 45a of the common dielectric film 51 located on the second IDT electrode 42 side may be inclined from the major surface 6a of the piezoelectric film 6 unlike the case of FIG. 14. Also in this case, since α2>α3 is satisfied, the characteristics are difficult to degrade due to polarization reversal as in the fifth preferred embodiment.

Figure 17:
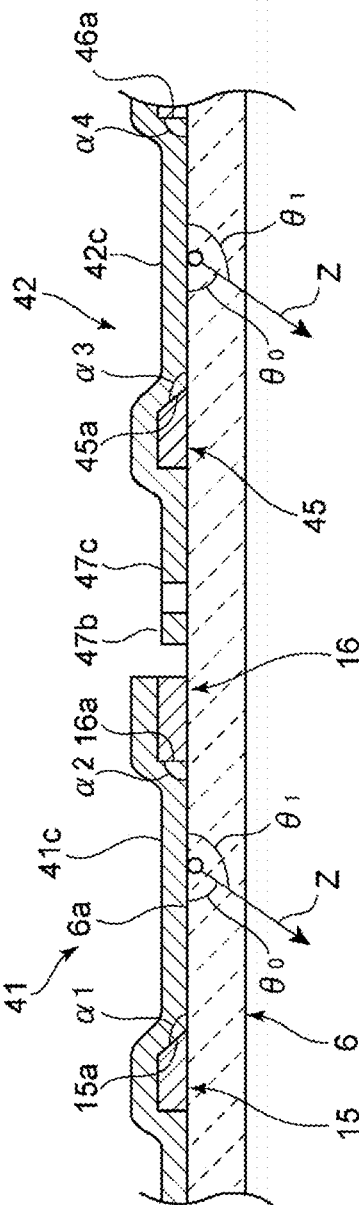
FIG. 17 is a side sectional view for explaining the angles α1 to α4 defined by first to fourth side surfaces and the major surface of a piezoelectric film in an acoustic wave device according to a sixth preferred embodiment of the present invention.

FIG. 17 is a side sectional view for explaining the angles α1 to α4 defined by first to fourth side surfaces and the major surface of a piezoelectric film in an acoustic wave device according to a sixth preferred embodiment of the present invention. In the acoustic wave device of the sixth preferred embodiment, in the first IDT electrode 41, the first side surface 15a is located on the side on which the Z axis of the crystal of the piezoelectric film 6 and the major surface 6a of the piezoelectric film 6 define a smaller angle, and the second side surface 16a is located on the larger angle side. In the second IDT electrode 42, the third side surface 45a is located on the side on which the major surface 6a and the Z axis define a smaller angle, and the fourth side surface 46a is located on the larger angle side. Thus, in this case, α1>α2 and α3>α4 hold. With this, polarization reversal is difficult to occur during driving and the characteristics of the acoustic wave device are thus difficult to degrade.

Figures 18, 19:
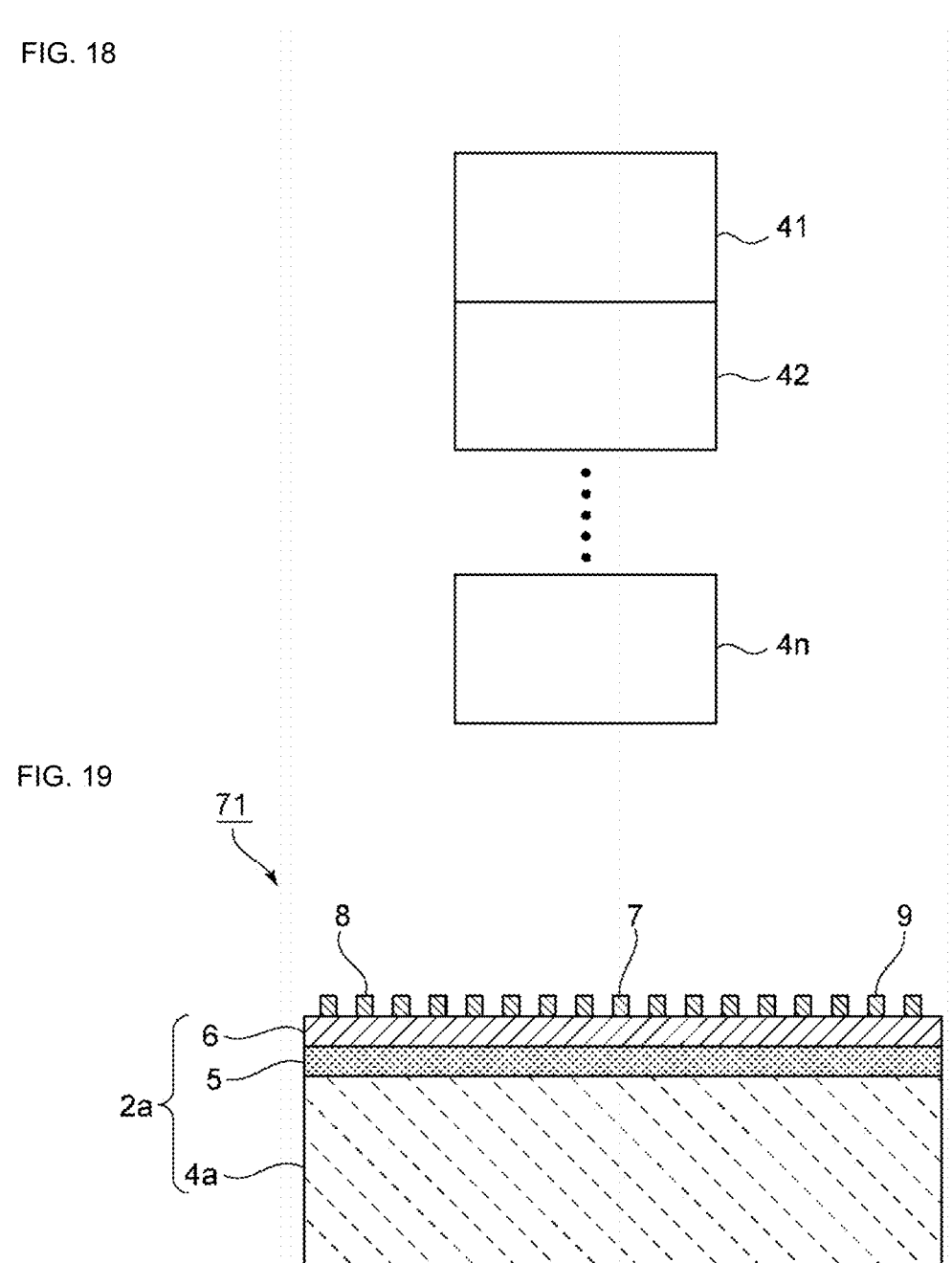
FIG. 18 is a schematic plan view of an acoustic wave device according to a seventh preferred embodiment of the present invention.
FIG. 19 is a front sectional view of an acoustic wave device according to an eighth preferred embodiment of the present invention.

FIG. 18 is a schematic plan view of an acoustic wave device according to a seventh preferred embodiment of the present invention. Although the first and second IDT electrodes 41 and 42 are connected to each other in FIG. 11, three or more IDT electrodes may be connected to each other in a preferred embodiment of the present invention. That is, as illustrated in FIG. 18, n IDT electrodes including the first IDT electrode 41, the second IDT electrode 42, and an nth IDT electrode 4n may be connected to each other. Thus, it is only necessary that at least two IDT electrodes of the n IDT electrodes include the first and second IDT electrodes 41 and 42. Note that, n is an integer of 3 or more. In such a case, it is preferably that at least one IDT electrode has the configuration according to a preferred embodiment of the present invention. All the IDT electrodes preferably and desirably have a configuration similar to that of the first preferred embodiment. With this, the degradation of characteristics due to polarization reversal can be prevented more effectively.

FIG. 19 is a front sectional view of an acoustic wave device 71 according to an eighth preferred embodiment. In the acoustic wave device 71, a piezoelectric substrate 2a includes a high acoustic velocity support substrate 4a, the low acoustic velocity material layer 5, and the piezoelectric film 6. In this way, by using the high acoustic velocity support substrate 4a made of a high acoustic velocity material, the integration of the support substrate 3 and the high acoustic velocity material layer 4, which are illustrated in FIG. 3, may be integrated.

Figures 20, 21:
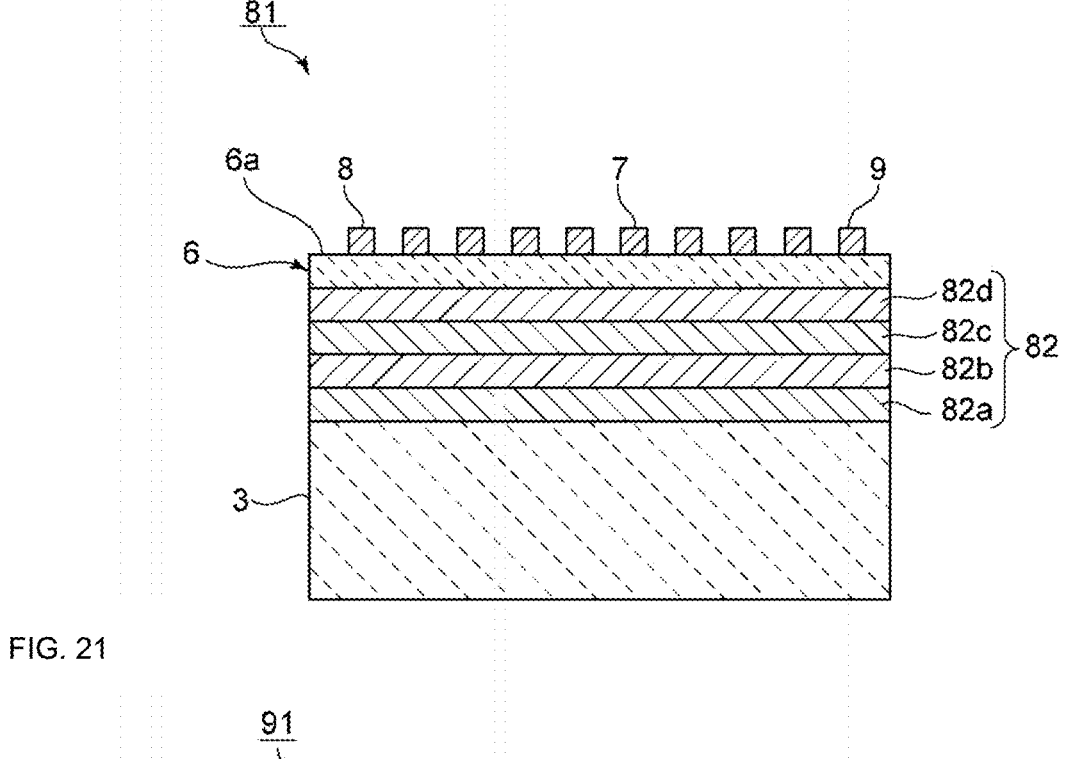
FIG. 20 is a front sectional view of an acoustic wave device according to a ninth preferred embodiment of the present invention.
FIG. 21 is a front sectional view of an acoustic wave device according to a tenth preferred embodiment of the present invention.

FIG. 20 is a front sectional view of an acoustic wave device according to a ninth preferred embodiment of the present invention. In an acoustic wave device 81, in the piezoelectric substrate 2, an acoustic reflection layer 82 is stacked between the support substrate 3 and the piezoelectric film 6. The acoustic reflection layer 82 has a structure in which a high acoustic impedance layer 82a, a low acoustic impedance layer 82b, a high acoustic impedance layer 82c, and a low acoustic impedance layer 82d are stacked in order from the support substrate 3 side. The high acoustic impedance layers 82a and 82c are made of a material having a relatively high acoustic impedance and the low acoustic impedance layers 82b and 82d are made of a material having a relatively low acoustic impedance. As such materials, appropriate materials satisfying the acoustic impedance relationship described above can be used.

FIG. 21 is a front sectional view of an acoustic wave device according to a tenth preferred embodiment of the present invention. In an acoustic wave device 91, a piezoelectric film 2b including a single-plate-shaped piezoelectric substrate made of a piezoelectric single crystal is used. In this way, the piezoelectric film according to a preferred embodiment of the present invention may include a piezoelectric single crystal substrate. As this piezoelectric single crystal, lithium tantalate, lithium niobate, or the like, which are described above, can be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric film in which a Z-axis direction of a crystal is different from a direction of a normal to a major surface; and
an IDT electrode on the major surface of the piezoelectric film; wherein
the IDT electrode includes:
first and second busbars;
a plurality of first electrode fingers connected to the first busbar; and
a plurality of second electrode fingers connected to the second busbar;
the plurality of first electrode fingers and the plurality of second electrode fingers are interdigitated with each other;
a region in which the first electrode fingers and the second electrode fingers are overlapped with each other in a direction in which an acoustic wave is propagated is an overlap region;
the overlap region includes:
a central region;
a first edge region located on a first busbar side of the central region in a direction in which the first and second electrode fingers extend; and
a second edge region located on a second busbar side of the central region in the direction in which the first and second electrode fingers extend;
the acoustic wave device further comprises, in the first and second edge regions, first and second dielectric films each located between the major surface of the piezoelectric film and the first and second electrode fingers;

the first dielectric film includes, in the first edge region, a first side surface located on the second busbar side;

the second dielectric film includes, in the second edge region, a second side surface located on the first busbar side; and when an angle between the first side surface and the major surface of the piezoelectric film is denoted by $\alpha1$ and an angle between the second side surface and the major surface of the piezoelectric film is denoted by $\alpha2$, $\alpha1 \neq \alpha2$ is satisfied between at least one electrode finger of the plurality of first and second electrode fingers and the piezoelectric film.

2. The acoustic wave device according to claim 1, wherein $\alpha1 \neq \alpha2$ is satisfied between each of the plurality of first electrode fingers and the plurality of second electrode fingers and the piezoelectric film.

3. The acoustic wave device according to claim 1, wherein in a cross section taken along the direction in which the first or second electrode finger extends, $\alpha1 > \alpha2$ is satisfied when the first side surface is located on a side on which the Z axis and the major surface of the piezoelectric film define a smaller angle, and $\alpha2 > \alpha1$ is satisfied when the second side surface is located on the side on which the Z axis and the major surface of the piezoelectric film define the smaller angle.

4. The acoustic wave device according to claim 1, wherein the IDT electrode is a first IDT electrode;

the acoustic wave device further comprises a second IDT electrode connected to the first IDT electrode;

the second IDT electrode includes:

third and fourth busbars;

a plurality of third electrode fingers connected to the third busbar; and a plurality of fourth electrode fingers connected to the fourth busbar;

the plurality of third electrode fingers and the plurality of fourth electrode fingers are interdigitated with each other;

a region in which the third electrode fingers and the fourth electrode fingers are overlapped with each other as seen from an acoustic wave propagation direction is a second overlap region;

the second overlap region includes:

a central region;

a third edge region located on a third busbar side of the central region in a direction in which the third and fourth electrode fingers extend; and a fourth edge region located on a fourth busbar side of the central region in the direction in which the third and fourth electrode fingers extend;

the second busbar and the third busbar are integrated with each other to define a common busbar;

the acoustic wave device further comprises, in the third and fourth edge regions, third and fourth dielectric films each located between the major surface of the piezoelectric film and the third and fourth electrode fingers;

the third dielectric film includes, in the third edge region, a third side surface located on the fourth busbar side;

the fourth dielectric film includes, in the fourth edge region, a fourth side surface located on the third busbar side; and when an angle between the third side surface of the third dielectric film and the major surface of the piezoelectric film is denoted by $\alpha3$ and an angle between the fourth side surface of the fourth dielectric film and the major surface of the piezoelectric film is denoted by $\alpha4$, $\alpha3$ or $\alpha4$ is different from at least one other of $\alpha1$, $\alpha2$, $\alpha3$, and $\alpha4$.

5. The acoustic wave device according to claim 4, wherein $\alpha2 > \alpha1$ and $\alpha4 > \alpha3$ are satisfied when the second side surface and the fourth side surface are located on a side on which the Z axis and the major surface of the piezoelectric film define a smaller angle in a cross section taken along the direction in which the first and second electrode fingers and the third and fourth electrode fingers extend.

6. The acoustic wave device according to claim 4, wherein $\alpha1 > \alpha2$ and $\alpha3 > \alpha4$ are satisfied when the first side surface and the third side surface are located on a side on which the Z axis and the major surface of the piezoelectric film define a smaller angle in a cross section taken along the direction in which the first and second electrode fingers and the third and fourth electrode fingers extend.

7. The acoustic wave device according to claim 5, wherein the second dielectric film and the third dielectric film are connected to and integrated with each other.

8. The acoustic wave device according to claim 5, further comprising:

n number of IDT electrodes connected to each other, where n is an integer; wherein at least two IDT electrodes of the n number of IDT electrodes are the first and second IDT electrodes.

9. The acoustic wave device according to claim 1, further comprising:

a support substrate;

a high acoustic velocity material layer located between the support substrate and the piezoelectric film and made of a high acoustic velocity material through which a bulk wave is propagated at an acoustic velocity higher than an acoustic velocity at which an acoustic wave is propagated through the piezoelectric film; and a low acoustic velocity material layer located between the high acoustic velocity material layer and the piezoelectric film and made of a low acoustic velocity material through which a bulk wave is propagated at an acoustic velocity lower than an acoustic velocity at which a bulk wave is propagated through the piezoelectric film.

10. The acoustic wave device according to claim 9, wherein the support substrate is made of the high acoustic velocity material and is a high acoustic velocity support substrate that includes the support substrate and the high acoustic velocity material layer that are integrated with each other.

11. The acoustic wave device according to claim 9, wherein the piezoelectric film is made of lithium tantalate or lithium niobate;

the high acoustic velocity material layer is made of at least one kind of material selected from a group consisting of aluminum nitride, aluminum oxide, silicon nitride, and DLC; and the low acoustic velocity material layer is made of silicon oxide.

12. The acoustic wave device according to claim 11, wherein the piezoelectric film is made of lithium tantalate.

13. The acoustic wave device according to claim 1, further comprising:

a support substrate; and an acoustic reflection layer between the support substrate and the piezoelectric film; wherein the acoustic reflection layer includes:

a high acoustic impedance layer with a relatively high
acoustic impedance; and
a low acoustic impedance layer with a relatively low
acoustic impedance.
14. The acoustic wave device according to claim 1,
wherein the piezoelectric film is a piezoelectric single crystal substrate.
15. The acoustic wave device according to claim 2,
wherein
the IDT electrode is a first IDT electrode;
the acoustic wave device further comprises a second IDT
electrode connected to the first IDT electrode;
the second IDT electrode includes:
third and fourth busbars;
a plurality of third electrode fingers connected to the
third busbar; and
a plurality of fourth electrode fingers connected to the
fourth busbar;
the plurality of third electrode fingers and the plurality of
fourth electrode fingers are interdigitated with each
other;
a region in which the third electrode fingers and the fourth
electrode fingers are overlapped with each other as seen
from an acoustic wave propagation direction is a second overlap region;
the second overlap region includes:
a central region;
a third edge region located on a third busbar side of the
central region in a direction in which the third and
fourth electrode fingers extend; and
a fourth edge region located on a fourth busbar side of
the central region in the direction in which the third
and fourth electrode fingers extend;
the second busbar and the third busbar are integrated with
each other to define a common busbar;
the acoustic wave device further comprises, in the third
and fourth edge regions, third and fourth dielectric
films each located between the major surface of the
piezoelectric film and the third and fourth electrode
fingers;
the third dielectric film includes, in the third edge region,
a third side surface located on the fourth busbar side;
the fourth dielectric film includes, in the fourth edge
region, a fourth side surface located on the third busbar
side; and
when an angle between the third side surface of the third
dielectric film and the major surface of the piezoelectric
film is denoted by α3 and an angle between the fourth
side surface of the fourth dielectric film and the major
surface of the piezoelectric film is denoted by α4, α3 or
α4 is different from at least one other of α1, α2, α3, and
α4.
16. The acoustic wave device according to claim 3,
wherein
the IDT electrode is a first IDT electrode;
the acoustic wave device further comprises a second IDT
electrode connected to the first IDT electrode;
the second IDT electrode includes:
third and fourth busbars;
a plurality of third electrode fingers connected to the
third busbar; and
a plurality of fourth electrode fingers connected to the
fourth busbar;

the plurality of third electrode fingers and the plurality of
fourth electrode fingers are interdigitated with each
other;
a region in which the third electrode fingers and the fourth
electrode fingers are overlapped with each other as seen
from an acoustic wave propagation direction is a second overlap region;
the second overlap region includes:
a central region;
a third edge region located on a third busbar side of the
central region in a direction in which the third and
fourth electrode fingers extend; and
a fourth edge region located on a fourth busbar side of
the central region in the direction in which the third
and fourth electrode fingers extend;
the second busbar and the third busbar are integrated with
each other to define a common busbar;
the acoustic wave device further comprises, in the third
and fourth edge regions, third and fourth dielectric
films each located between the major surface of the
piezoelectric film and the third and fourth electrode
fingers;
the third dielectric film includes, in the third edge region,
a third side surface located on the fourth busbar side;
the fourth dielectric film includes, in the fourth edge
region, a fourth side surface located on the third busbar
side; and
when an angle between the third side surface of the third
dielectric film and the major surface of the piezoelectric
film is denoted by α3 and an angle between the fourth
side surface of the fourth dielectric film and the major
surface of the piezoelectric film is denoted by α4, α3 or
α4 is different from at least one other of α1, α2, α3, and
α4.
17. The acoustic wave device according to claim 2, further
comprising:
a support substrate; and
an acoustic reflection layer between the support substrate
and the piezoelectric film; wherein
the acoustic reflection layer includes:
a high acoustic impedance layer with a relatively high
acoustic impedance; and
a low acoustic impedance layer with a relatively low
acoustic impedance.
18. The acoustic wave device according to claim 3, further
comprising:
a support substrate; and
an acoustic reflection layer between the support substrate
and the piezoelectric film; wherein
the acoustic reflection layer includes:
a high acoustic impedance layer with a relatively high
acoustic impedance; and
a low acoustic impedance layer with a relatively low
acoustic impedance.
19. The acoustic wave device according to claim 4, further
comprising:
a support substrate; and
an acoustic reflection layer between the support substrate
and the piezoelectric film; wherein
the acoustic reflection layer includes:
a high acoustic impedance layer with a relatively high
acoustic impedance; and
a low acoustic impedance layer with a relatively low
acoustic impedance.

* * * * *